United States Patent
Son et al.

(10) Patent No.: US 11,786,946 B2
(45) Date of Patent: Oct. 17, 2023

(54) CLEANING METHOD AND FILM FORMING APPARATUS

(71) Applicant: TOKYO ELECTRON LIMITED, Tokyo (JP)

(72) Inventors: Sung Duk Son, Gyeonggi-do (KR); Shingo Hishiya, Nirasaki (JP); Akinobu Kakimoto, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 54 days.

(21) Appl. No.: 16/354,619

(22) Filed: Mar. 15, 2019

(65) Prior Publication Data

US 2019/0283093 A1 Sep. 19, 2019

(30) Foreign Application Priority Data

Mar. 19, 2018 (JP) .................................. 2018-051286

(51) Int. Cl.
*B08B 9/08* (2006.01)
*C23C 16/44* (2006.01)
*B08B 5/00* (2006.01)

(52) U.S. Cl.
CPC .................. *B08B 9/08* (2013.01); *B08B 5/00* (2013.01); *C23C 16/4405* (2013.01); *B08B 2209/08* (2013.01)

(58) Field of Classification Search
CPC ......... B08B 9/08; B08B 5/00; B08B 2209/08; C23C 16/4405; C23C 16/45563; C23C 16/45561; C23C 16/401; C23C 16/45525; H01J 37/32449; H01J 37/32862; H01L 21/02057; H01L 21/6706

See application file for complete search history.

(56) References Cited

U.S. PATENT DOCUMENTS

| | | | | |
|---|---|---|---|---|
| 5,609,721 A * | 3/1997 | Tsukune | .............. | C23C 16/4405 134/22.11 |
| 6,903,025 B2 * | 6/2005 | Mizushima | ......... | C23C 16/4405 134/22.1 |
| 7,140,374 B2 * | 11/2006 | Bailey, III | ................ | B08B 7/00 134/22.1 |

(Continued)

FOREIGN PATENT DOCUMENTS

JP 2005-333110 A 12/2005

*Primary Examiner* — Duy Vu N Deo
*Assistant Examiner* — Christopher Remavege
(74) *Attorney, Agent, or Firm* — Nath, Goldberg & Meyer; Jerald L. Meyer; Tanya E. Harkins

(57) ABSTRACT

There is provided a method of cleaning a film forming apparatus conducted after a film forming process by supplying a source gas and a reaction gas to produce a reaction product into a processing container to form a film of the reaction product on a substrate. The method includes: controlling, in the film forming process, a first film deposited in the processing container and a second film deposited in a source gas supply part to become different kinds of films; performing, after the film forming process, a cleaning process by supplying a cleaning gas having an etching selection ratio of the second film to the first film being greater than 1 so as to etch and remove the second film; and performing, after the cleaning process, a surface control process of making a surface state of the first film close to a state before the cleaning process was performed.

16 Claims, 6 Drawing Sheets

(56) References Cited

U.S. PATENT DOCUMENTS

| | | | | |
|---|---|---|---|---|
| 7,368,384 B2* | 5/2008 | Endo | | B08B 7/0035 438/689 |
| 7,615,163 B2* | 11/2009 | Tamura | | B08B 7/0035 216/63 |
| 9,142,393 B2* | 9/2015 | Okabe | | H01J 37/32862 |
| 9,238,257 B2* | 1/2016 | Sakai | | H01L 21/67028 |
| 9,653,326 B2* | 5/2017 | Noda | | H01L 21/67011 |
| 9,920,424 B2* | 3/2018 | Goto | | H01L 21/02041 |
| 2001/0055738 A1* | 12/2001 | Takahashi | | C23C 16/4405 432/2 |
| 2005/0136657 A1* | 6/2005 | Yokoi | | C23C 16/34 438/680 |
| 2005/0211264 A1* | 9/2005 | Kostenko | | H01J 37/32972 134/1.1 |
| 2006/0042544 A1* | 3/2006 | Hasebe | | C23C 16/4405 118/715 |
| 2006/0065289 A1* | 3/2006 | Tamaoki | | B08B 7/0035 134/2 |
| 2006/0081182 A1* | 4/2006 | Okada | | C23C 16/4405 134/1 |
| 2006/0213539 A1* | 9/2006 | Hasebe | | C23C 16/4404 427/535 |
| 2009/0124083 A1* | 5/2009 | Nodera | | H01J 37/3244 156/345.24 |
| 2009/0305517 A1* | 12/2009 | Nakashima | | C23C 16/4405 118/724 |
| 2010/0167541 A1* | 7/2010 | Kato | | H01L 21/02255 438/680 |
| 2010/0175713 A1* | 7/2010 | Fukiage | | H01J 37/32192 134/1.1 |
| 2012/0064733 A1* | 3/2012 | Sasajima | | C23C 16/45527 257/E21.24 |
| 2013/0065402 A1* | 3/2013 | Kameda | | C23C 16/4405 438/758 |
| 2014/0318457 A1* | 10/2014 | Umezawa | | C23C 16/4408 118/725 |
| 2014/0345644 A1* | 11/2014 | Okabe | | C23C 16/4405 134/1.1 |
| 2015/0031216 A1* | 1/2015 | Akae | | C23C 16/45529 118/704 |
| 2015/0099373 A1* | 4/2015 | Sano | | H01J 37/32394 438/763 |
| 2015/0376781 A1* | 12/2015 | Kogura | | H01L 21/02126 438/758 |
| 2016/0362784 A1* | 12/2016 | Isobe | | C23C 16/405 |
| 2016/0376699 A1* | 12/2016 | Sasaki | | C23C 16/45544 118/697 |
| 2017/0260626 A1* | 9/2017 | Nagato | | H01L 21/02164 |
| 2018/0108518 A1* | 4/2018 | Noro | | H01J 37/32862 |
| 2018/0155829 A1* | 6/2018 | Tamura | | C23C 14/505 |

* cited by examiner

CLEANING METHOD AND FILM FORMING APPARATUS

CROSS-REFERENCE TO RELATED APPLICATION

This application is based upon and claims the benefit of priority from Japanese Patent Application No. 2018-051286, filed on Mar. 19, 2018, the entire contents of which are incorporated herein by reference.

TECHNICAL FIELD

The present disclosure relates to a cleaning method and a film forming apparatus.

BACKGROUND

There is known a film forming apparatus that performs a film forming process by supplying a film forming gas into a processing container from a gas introduction pipe in the state in which a substrate is accommodated in a processing container so as to form a film on the substrate. In this film forming apparatus, when the film forming gas is supplied into a processing container, the film forming gas undergoes a thermal reaction, a reaction product generated by the thermal reaction is deposited on the substrate, and a film is formed on the substrate.

Incidentally, the reaction product generated by the film forming process adheres to the inside of the film forming apparatus such as an inner wall of the processing container, the gas introduction pipe or the like, in addition to the substrate. When the film forming process is repeated in the state in which the reaction product adheres to the inside of the film forming apparatus, the reaction product is peeled off, thus generating particles. When the particles adhere to substrates, the manufacturing yield of semiconductor devices is negatively impacted.

Therefore, a cleaning method is proposed where after performing a film forming process, a cleaning gas containing a hydrogen fluoride gas is supplied from a gas introduction pipe to remove a reaction product, which adhered to the inside of the film forming apparatus, thereby cleaning the inside of the film forming apparatus.

SUMMARY

However, in the above cleaning method, since a reaction product, which adhered to the inner wall of the gas introduction pipe, and a reaction product, which adhered to substrate processing regions such as the inner wall of the processing container or the like, are simultaneously removed, a surface state of the substrate processing region changes. Therefore, when the cleaning process is performed on the film forming apparatus, a coating process is performed in which a predetermined film is formed in the substrate processing regions to stabilize the surface state of the substrate processing regions, and then the film forming process is resumed. Since the time required for the coating process is relatively long, productivity is deteriorated.

In view of the above, an embodiment of the present disclosure provides a cleaning method capable of suppressing the deterioration in productivity, which is caused due to performing a cleaning process on a film forming apparatus.

According to one embodiment of the present disclosure, there is provided a method of cleaning a film forming apparatus conducted after a film forming process by supplying a source gas and a reaction gas reactive with the source gas to produce a reaction product into the processing container to form a film of the reaction product on a substrate, the method including: controlling, in the film forming process, a first film deposited in the processing container and a second film deposited in a source gas supply part supplying the source gas into the processing container to become different kinds of films; performing, after the film forming process, a cleaning process by supplying a cleaning gas having an etching selection ratio of the second film to the first film being greater than 1 from the source gas supply part into the processing container so as to etch and remove the second film deposited in the source gas supply part; and performing, after the cleaning process, a surface control process of making a surface state of the first film deposited in the processing container close to a state before the cleaning process was performed.

According to another embodiment of the present disclosure, there is provided a film forming apparatus including: a processing container configured to accommodate a substrate; a source gas supply part configured to supply a source gas into the processing container; a reaction gas supply part configured to supply a reaction gas reactive with the source gas to produce a film of a reaction product into the processing container; and a controller configured to control the source gas supply part and the reaction gas supply part, wherein the controller controls the source gas supply part and the reaction gas supply part to perform a process including: controlling, in a film forming process of forming the film of the reaction product on the substrate, a first film deposited in the processing container and a second film deposited in the source gas supply part to become different kinds of films; performing, after the film forming process, a cleaning process by supplying a cleaning gas having an etching selection ratio of the second film to the first film being greater than 1 from the source gas supply part into the processing container so as to etch and remove the second film deposited in the source gas supply part; and performing, after the cleaning process, a surface control process of making a surface state of the first film deposited in the processing container close to a state before the cleaning process was performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
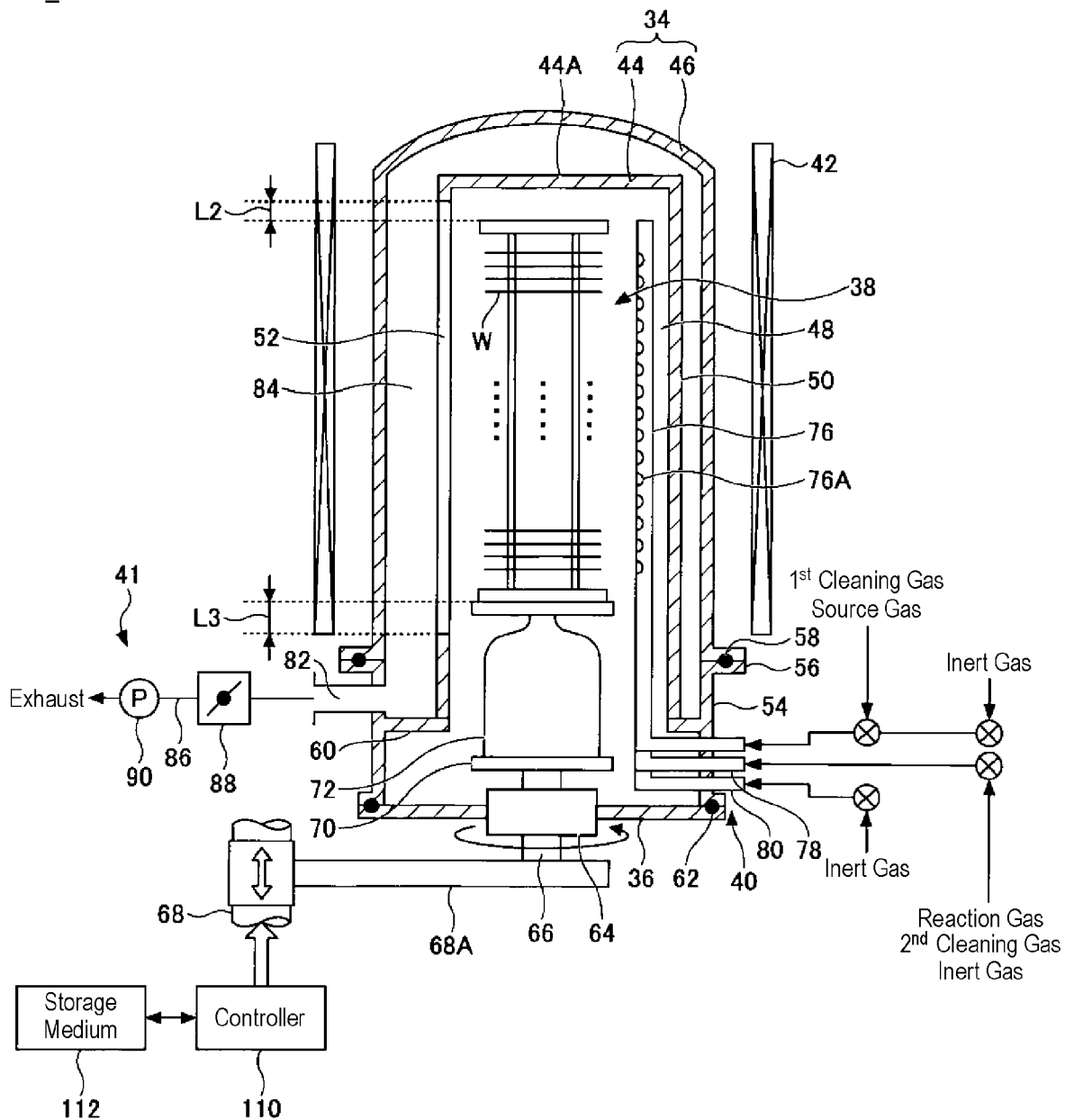
FIG. 1 is a cross-sectional view illustrating an example of a vertical heat treatment apparatus according to an embodiment of the present disclosure.

Reference will now be made in detail to various embodiments, examples of which are illustrated in the accompanying drawings. In the specification and drawings, constituent elements that are substantially the same will be denoted by the same reference numerals, and redundant descriptions will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Overall Configuration of Film Forming Apparatus

Figure 2:
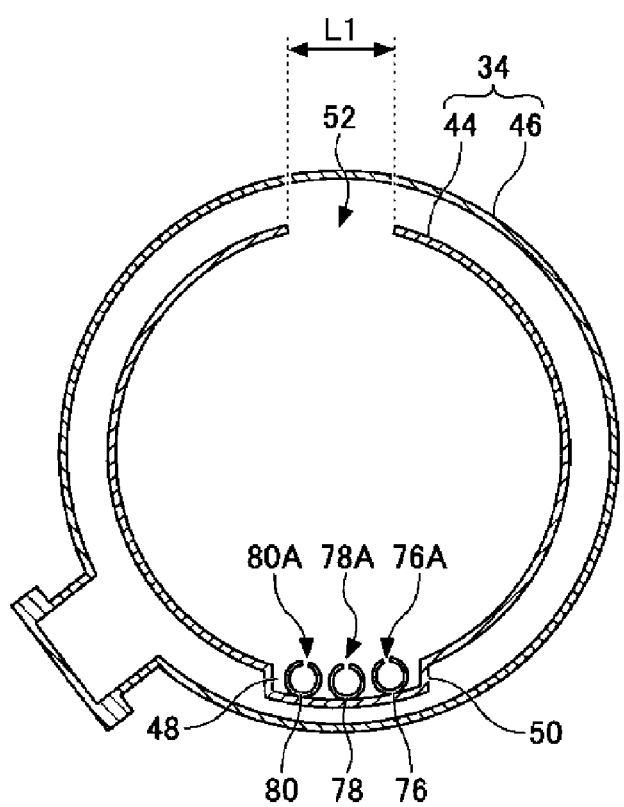
FIG. 2 is a view for explaining a processing container of the vertical heat treatment apparatus of FIG. 1.

A film forming apparatus to which a cleaning method according to an embodiment of the present disclosure is applicable will be described by taking a batch-type vertical heat treatment apparatus as an example. FIG. 1 is a cross-sectional view illustrating an example of a vertical heat treatment apparatus according to the embodiment of the present disclosure. FIG. 2 is a view for explaining a processing container of the vertical heat treatment apparatus of FIG. 1.

In an embodiment, a vertical heat treatment apparatus 1 includes a processing container 34 configured to accommodate a semiconductor wafer (hereinafter referred to as a "wafer W") as a substrate, a lid 36 configured to hermetically close an opening portion at a lower end of the processing container 34, a wafer boat 38, which is a substrate holder configured to hold a plurality of wafers W at predetermined intervals, the wafer boat 38 being capable of being accommodated in the processing container 34 and, a gas supply part 40 configured to supply a predetermined gas into the processing container 34, an exhaust part 41 configured to exhaust the gas in the processing container 34, and a heater 42 configured to heat the wafer W.

The processing container 34 has a cylindrical inner tube 44 which has a ceiling and an opened lower end, and a cylindrical outer tube 46 which has a ceiling and an opened lower end and covers an outer side of the inner tube 44. The inner tube 44 and the outer tube 46 are made of a heat resistant material such as quartz or the like, and are arranged coaxially to form a double-tube structure.

A ceiling part 44A of the inner tube 44 may be flat. On one side of the inner tube 44, a nozzle accommodation part 48 configured to accommodate a gas nozzle is provided along a longitudinal direction of the inner tube 44 (vertical direction). In the embodiment of the present disclosure, as shown in FIG. 2, a portion of the side wall of the inner tube 44 protrudes outward so as to form a convex portion 50, and an inner portion of the convex portion 50 is formed as a nozzle accommodation part 48.

In addition, in the side wall of the inner tube 44 opposite the nozzle accommodation part 48, a rectangular opening 52 having a width L1 is provided in the longitudinal direction of the inner tube 44 (vertical direction).

The opening 52 is a gas exhaust port formed to exhaust the gas in the inner tube 44. The length of the opening 52 is equal to a length of the wafer boat 38 or extends upwards and downwards in the vertical direction to be longer than the length of the wafer boat 38. That is, an upper end of the opening 52 extends to a height equal to or higher than a position corresponding to an upper end of the wafer boat 38, and a lower end of the opening 52 extends to a height equal to or less than a position corresponding to a lower end of the wafer boat 38. Specifically, as shown in FIG. 1, a distance L2 in a height direction between the upper end of the wafer boat 38 and the upper end of the opening 52 is in a range of about 0 mm to 5 mm. The distance L3 in a height direction between the lower end of the wafer boat 38 and the lower end of the opening 52 is in a range of about 0 mm to 350 mm.

The lower end of the processing container 34 may be supported by a cylindrical manifold 54 made of, for example, stainless steel. A flange part 56 is formed at an upper end of the manifold 54, and the lower end part of the outer tube 46 is installed on the flange part 56 so as to be supported. A seal member 58 such as an O-ring or the like is interposed between the flange part 56 and the lower end part of the outer tube 46 so that the inside of the outer tube 46 is hermetically sealed.

A circular annular support portion 60 is provided on the inner wall of the upper part of the manifold 54, and the lower end part of the inner tube 44 is installed on the support portion 60 so as to be supported. The lid 36 is hermetically installed to an opening at the lower end of the manifold 54 via a seal member 62 such as an O-ring or the like so as to hermetically close the opening at the lower end of the processing container 34, that is, the opening of the manifold 54. The lid 36 may be formed from stainless steel.

In a central portion of the lid 36, a rotary shaft 66 is provided through a magnetic fluid seal part 64. A lower part of the rotary shaft 66 is rotatably supported by an arm 68A of a lift part 68 configured as a boat elevator.

A rotary plate 70 is provided at an upper end of the rotary shaft 66, and the wafer boat 38 that holds wafers W is mounted on the rotary plate 70 via a quartz heat insulating base 72. Therefore, by moving the lift part 68 up and down, the lid 36 and the wafer boat 38 move vertically as an integrated body, so that the wafer boat 38 can be inserted into and removed from the processing container 34.

The gas supply part 40 is provided in the manifold 54 and supplies gas into the inner tube 44. The gas supply part 40 has a plurality of (e.g., three) quartz gas nozzles 76, 78, and 80. Each of the gas nozzles 76, 78 and 80 is provided within the inner tube 44 in the longitudinal direction, and each base end of the gas nozzles 76, 78 and 80 is bent in an L shape and penetrates the manifold 54 so as to be supported.

As shown in FIG. 2, the gas nozzles 76, 78, and 80 are installed in the nozzle accommodation part 48 of the inner tube 44 in a row along the circumferential direction. A plurality of gas holes 76A, 78A, and 80A are formed at predetermined intervals in each of the gas nozzles 76, 78, and 80 along longitudinal directions thereof, so that a gas can be ejected horizontally from each of the plurality of gas holes 76A, 78A, and 80A. The predetermined interval may be set to be equal to the interval of the wafers W supported by the wafer boat 38. The positions in the height direction are set such that each of the gas holes 76A, 78A, and 80A is located in the middle between vertically adjacent wafers W, so that each gas can be efficiently supplied in a space between the wafers W.

As the kinds of gases, a source gas, a reaction gas, a first cleaning gas, a second cleaning gas, and an inert gas are used, and each of the gases is supplied through each of the gas nozzles 76, 78, and 80 as necessary while the flow rates of the gases are controlled. In the present embodiment, the gas nozzle 76 supplies the source gas, the first cleaning gas, and the inert gas. The inert gas supplied from the gas nozzle 76 may be supplied from and upstream side of the source gas, and functions as a carrier gas. The gas nozzle 78 supplies the reaction gas, the second cleaning gas, and the inert gas. The gas nozzle 80 supplies the inert gas.

The source gas may be a silicon containing gas. The silicon containing gas may be, dichlorosilane (DCS: $SiH_2Cl_2$), hexachlorodisilane (HCD: $Si_2Cl_6$), tetrachlorosilane ($SiCl_4$), trichlorosilane ($SiHCl_3$), octachlorotrisilane ($Si_3Cl_8$), an aminosilane-based compound, a siloxane compound. The aminosilane-based compound may be butylaminosilane (BAS), bis (tertiary-butyl-amino) silane (BTBAS), dimethylaminosilane (DMAS), bisdimethylaminosilane (BDMAS), dipropylaminosilane (DPAS), or diisopropylaminosilane (DIPAS).

The source gas may be a metal containing gas. The metal containing gas may be titanium tetrachloride ($TiCl_4$), trimethylaluminum (TMA), aluminum chloride ($AlCl_3$), tetrakis (dimethylamino) hafnium (TDMAH: $Hf[N(CH_3)_2]_4$), tetrakis (N-ethylmethylamino) zirconium (TEMAZ), or tri (dimethylamino) cyclopentadienylzirconium (($C_5H_5$)Zr$[N(CH_3)_2]_3$).

The reaction gas may be a gas that can react with the source gas to form a reaction product. The reaction gas may be an oxidizing gas. The oxidizing gas may be a mixture gas of hydrogen ($H_2$) and oxygen ($O_2$), $O_2$, water vapor ($H_2O$), ozone ($O_3$), a mixture gas of $H_2$ and $O_3$, nitrogen monoxide (NO), nitrous oxide ($N_2O$), nitrogen dioxide ($NO_2$), carbon monoxide (CO), or carbon dioxide ($CO_2$). In addition, the reaction gas may be a nitriding gas. The nitriding gas may be ammonia ($NH_3$), organic amine gas, diazene ($N_2H_2$), hydrazine ($N_2H_4$), or a hydrazine compound. The hydrazine compound may be monomethyl hydrazine (MMH).

When the source gas is a silicon containing gas and the reaction gas is an oxidizing gas, a silicon oxide film may be formed on the wafer W. When the source gas is a silicon containing gas and the reaction gas is a nitriding gas, a silicon nitride film may be formed on the wafer W. When the source gas is a metal containing gas and the reaction gas is an oxidizing gas, a metal oxide film may be formed on the wafer W. As the metal oxide film, a high dielectric constant film (high-k film) such as aluminum oxide (AlO) or the like may be used. When the source gas is a metal containing gas and the reaction gas is a nitriding gas, a metal nitride film may be formed on the wafer W.

The first cleaning gas is a gas having an etching selection ratio of a film deposited in the gas nozzle 76 to a film deposited in the processing container 34 being greater than 1 when a film forming process is performed to form a film of a reaction product on a wafer W by supplying the source gas and the reaction gas to the processing container 34. Hereinafter, the film deposited in the processing container 34 is referred to as a "first film", and the film deposited in the gas nozzle 76 is referred to as a "second film". The first cleaning gas may be selected depending on the type of a film formed on the wafer W in the film forming process. In the case of forming a silicon oxide film or a silicon nitride film on a wafer W in the film forming process, the first cleaning gas may be fluorine ($F_2$), chlorine ($Cl_2$), a mixture gas of $F_2$ and $Cl_2$, a mixture gas of $F_2$ and hydrogen fluoride (HF), a mixture gas of $F_2$ and $H_2$, a mixture gas of $F_2$, HF, and $NH_3$, nitrogen trifluoride ($NF_3$), or nitrogen trichloride ($NCl_3$). However, the first cleaning gas is preferably a gas having a high etching selection ratio of a silicon film to a silicon oxide film or the silicon nitride film such as $Cl_2$. This makes it possible to selectively remove a silicon film deposited in the gas nozzle 76 without substantially etching a silicon oxide film or a silicon nitride film deposited in the processing container 34. In the case of forming a metal oxide film or a metal nitride film on a wafer W in a film forming process, the first cleaning gas may be $Cl_2$.

The second cleaning gas is a gas capable of etching the first film deposited in the processing container 34. In the case of a silicon oxide film or a silicon nitride film, the second cleaning gas may be HF, a mixture gas of $F_2$ and HF, a mixture gas of $F_2$ and $H_2$, or $NF_3$.

In the case of a metal oxide film or a metal nitride film, the second cleaning gas may be hydrogen chloride (HCl).

The inert gas may be a rare gas such as helium (He), neon (Ne), argon (Ar) or the like, or nitrogen ($N_2$).

A gas outlet 82 is formed in the upper side wall of the manifold 54 above the support portion 60, so that the gas in the inner tube 44, which is exhausted from the opening 52 through a space part 84 between the inner tube 44 and the outer tube 46, can be exhausted. In the gas outlet 82, an exhaust part 41 is provided. The exhaust part 41 has an exhaust passage 86 connected to the gas outlet 82. A pressure regulation valve 88 and a vacuum pump 90 are sequentially provided in the exhaust passage 86, so that the inside of the processing container 34 can be evacuated.

On the outer circumferential side of the outer tube 46, a cylindrical heater 42 is provided so as to cover the outer tube 46. The heater 42 heats the wafers W accommodated in the processing container 34.

The overall operation of the vertical heat treatment apparatus 1 formed in this way is controlled by a controller 110 such as a computer or the like. A computer program that performs the overall operation of the vertical heat treatment apparatus 1 is stored in a storage medium 112. The storage medium 112 may be a flexible disk, a compact disk, a hard disk, a flash memory, or a DVD.

Cleaning Method

First Embodiment

Figure 3:
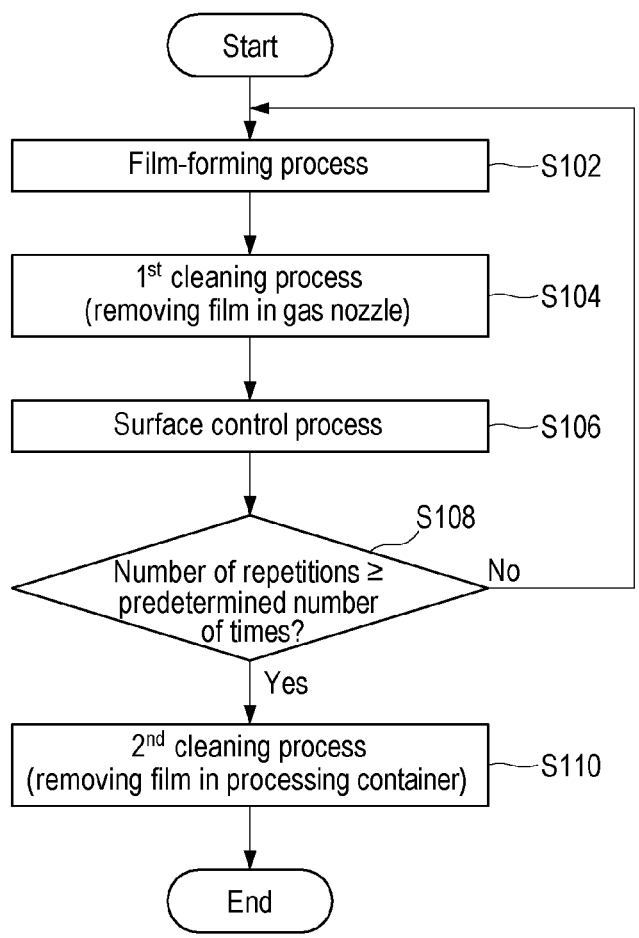
FIG. 3 is a flowchart illustrating an example of a cleaning method according to a first embodiment.
Figure 4:
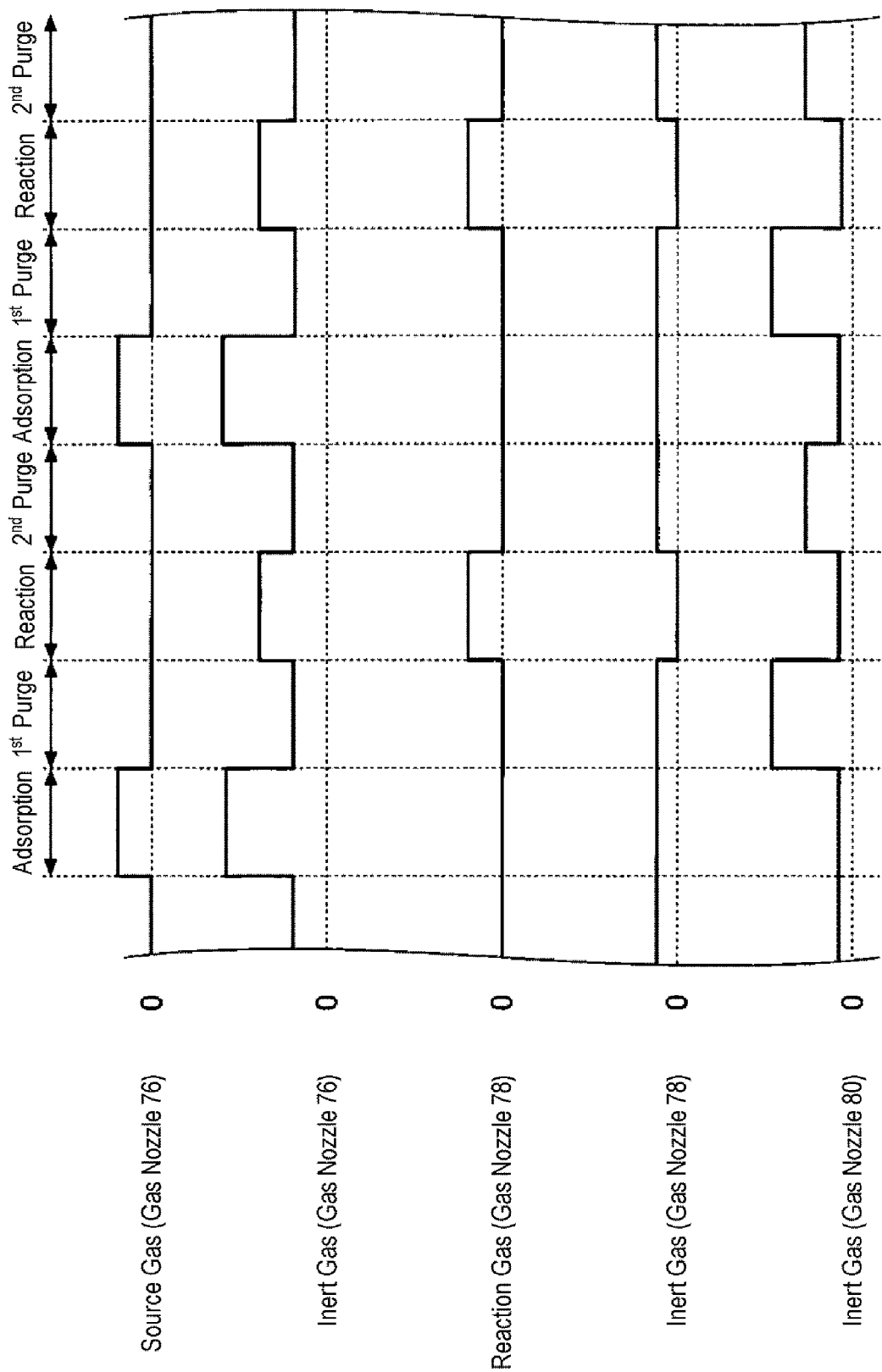
FIG. 4 is a timing chart for describing a film forming process.

An example of a cleaning method according to the first embodiment will be described. The cleaning method according to the first embodiment is performed, for example, by controlling, by the controller 110, the operation of respective parts of the vertical heat treatment apparatus 1. FIG. 3 is a flowchart illustrating an example of a cleaning method according to the first embodiment. FIG. 4 is a timing chart for describing a film forming process.

In an embodiment, a film forming process (S102) is performed first. In the film forming process (S102), a source gas and a reaction gas reacting with the source gas to produce a reaction product are supplied into the processing container 34 so as to form a film of the reaction product on a wafer W. In the film forming process (S102), a control is performed such that a first film deposited in the processing container 34 and a second film deposited in the gas nozzle 76 from which the source gas is supplied into the processing container 34 become different kind of films. As illustrated in FIG. 4, the film forming process (S102) may be a process based on an atomic layer deposition method that forms a film having a predetermined thickness on a wafer W by repeating an adsorption step, a first purge step, a reaction step, and a second purge step.

The adsorption step is a step of supplying the source gas and the inert gas into the processing container 34 from the gas nozzle 76 so as to cause the source gas to be adsorbed on the wafer W. In the adsorption step the flow rate of the inert gas supplied from the gas nozzle 76 may be controlled to be greater than the flow rate of the raw material gas supplied from the gas nozzle 76. However, the flow rate of the inert gas is not particularly limited as long as its carrier effect as an inert gas is sufficient. Prior to the adsorption step, it is preferable to start supplying the inert gas from the gas nozzle 76 into the processing container 34. The inert gas may be supplied from the gas nozzle 78 and the gas nozzle 80. The source gas may be, a silicon containing gas or a metal containing gas.

The first purge step is a step of purging the source gas remaining in the processing container 34 by supplying the inert gas into the processing container 34 from the gas nozzle 80 in a state in which the inert gas is supplied into the processing container 34 from the gas nozzle 76. The inert gas may be supplied from the gas nozzle 78. The inert gas may be a noble gas such as He, Ne, Ar or the like, or $N_2$.

The reaction step is a step of forming a film of a reaction product by supplying the reaction gas into the processing container 34 from the gas nozzle 78 in a state in which the inert gas is supplied into the processing container 34 from the gas nozzle 76, so as to cause the source gas adsorbed to the wafer W to react with the reaction gas. In the reaction step, the reaction gas is prevented from entering the gas nozzle 76 by the inert gas supplied into the processing container 34 from the gas nozzle 76. In other words, the inert gas supplied into the processing container 34 from the gas nozzle 76 functions as a counter flow with respect to the reaction gas. As a result, the film of the reaction product is deposited in the processing container 34 by the reaction of the source gas and the reaction gas, whereas the film generated by thermal decomposition of the source gas is deposited in the gas nozzle 76. That is, in the reaction step, different kinds of films are deposited in the processing container 34 and in the gas nozzle 76. The reaction gas may be an oxidizing gas or a nitriding gas. In the reaction step, the inert gas may be supplied from the gas nozzle 80.

The second purge step is a step of purging the reaction gas remaining in the processing container 34 by supplying the inert gas into the processing container 34 from the gas nozzle 80 in a state in which the inert gas is supplied into the processing container 34 from the gas nozzle 76. The inert gas may be supplied from the gas nozzle 78. The inert gas may be a noble gas such as He, Ne, Ar or the like, or $N_2$.

As described above, in the film forming process (S102), a control is performed such that the first film deposited in the processing container 34 and the second film deposited in the gas nozzle 76 become different kinds of films by performing the adsorption step, the first purge step, the reaction step, and the second purge step. When a silicon containing gas or a metal containing gas is used as a source gas and an oxidizing gas is used as a reaction gas, a silicon oxide film or a metal oxide film is formed as the first film and a silicon film or a metal film is formed as the second film. When a silicon containing gas or a metal containing gas is used as a source gas and a nitriding gas is used as a reaction gas, a silicon nitride film or a metal nitride film is formed as the first film and a silicon film or a metal film is formed as the second film. In the present embodiment, descriptions have been made of the case where an inert gas is constantly supplied from the gas nozzle 76 into the processing container 34 in the film forming process (S102) as an example, but the present disclosure is not limited thereto. It is sufficient if the inert gas supplied from the gas nozzle 76 is supplied at least when the reaction gas is being supplied from the gas nozzle 78 into the processing container 34. Further, in the present embodiment, descriptions have been made of the case where the inert gas is supplied from the gas nozzle 78 in the adsorption step, the first purge step, and the second purge step, and the case where the inert gas is supplied from the gas nozzle 80 in the adsorption step, the first purge step, the reaction step and the second purge step, but the supply of the inert gas is not limited thereto.

Subsequently, a first cleaning process (S104) is performed. In the first cleaning process (S104), a first cleaning gas having an etching selection ratio of the second film to the first film being greater than 1 is supplied from the gas nozzle 76 into the processing container 34 so as to etch and remove the second film deposited in the gas nozzle 76. The first cleaning process (S104) may be performed by raising the temperature inside the processing container 34 to 200 degrees C. to 500 degrees C. The first cleaning gas may be selected depending on the type of the film formed on the wafer W in the film forming process (S102). In the case of forming the silicon oxide film or the silicon nitride film on the wafer W in the film forming process (S102), the first cleaning gas may be $F_2$, $Cl_2$, a mixture gas of $F_2$ and $Cl_2$, a mixture gas of $F_2$ and HF, a mixture gas of $F_2$, HF, and $NH_3$, $NF_3$, or $NCl_3$. This makes it possible to remove a silicon film deposited in the gas nozzle 76 while suppressing the etching of a silicon oxide film or a silicon nitride film deposited in the processing container 34. The first cleaning gas is preferably a gas having a high etching selection ratio of a silicon film to a silicon oxide film or the silicon nitride film $Cl_2$. This makes it possible to selectively remove a silicon film deposited in the gas nozzle 76 without substantially etching a silicon oxide film or a silicon nitride film deposited in the processing container 34.

Subsequently, a surface control process (S106) is performed. In the surface control process (S106), a surface state of the first film deposited in the processing container 34 is made close to the state before performing the first cleaning process (S104). The surface control process (S106) is performed by raising the temperature inside the processing container 34 to 600 degrees C. to 800 degrees C. In the surface control process (S106), a gas selected depending on the type of the film formed on the wafer W in the film forming process (S102) is supplied into the processing container 34. In the case of forming a silicon oxide film in the film forming process (S102), an oxygen containing gas is supplied from the gas nozzle 78 into the processing container 34. The oxygen containing gas may be a mixture gas of $O_2$ and $H_2$, $O_2$, or $O_3$. Alternatively, the oxygen containing gas may be turned into plasma and supplied into the processing container 34. Further, ultraviolet (UV) may be radiated into the processing container 34 in the state in which an oxygen containing gas is supplied. In the case where two or more kinds of oxygen containing gases are used, the oxygen containing gases may be supplied using two or more gas nozzles 78 so as to be mixed in the processing container 34. Further $O_2$ and $H_2$ may be supplied so as to be mixed in the processing container 34. In the case of forming a silicon nitride film in the film forming process (S102), a nitrogen containing gas is supplied from the gas nozzle 78 into the processing container 34. The nitrogen containing gas may be $NH_3$, $N_2$ of which the temperature is raised to increase reactivity, or a mixture gas of $N_2$ and $H_2$. Alternatively, these nitrogen containing gases may be turned into plasma and supplied into the processing container 34. In the case where two or more kinds of nitrogen containing gases are used, the nitrogen containing gases may be supplied using two or more gas nozzles 78 so as to be mixed in the processing container 34.

Subsequently, a determination process (S108) is performed. In the determination process (S108), it is determined whether or not the number of repetitions of a cycle including the film forming process (S102), the first cleaning process (S104), and the surface control process (S106) is equal to or more than a predetermined number of times. In the determination process (S108), if it is determined that the number of repetitions of the cycle is equal to or more than the predetermined number of times, the process proceeds to a second cleaning process (S110). Meanwhile, if it is determined that the number of repetitions of the cycle is less than the predetermined number of times, the process returns to the film forming process (S102). The predetermined number of times is not particularly limited, but may be 100 times to 250 times.

Subsequently, a second cleaning process (S110) is performed. In the second cleaning process (S110), the second cleaning gas is supplied from the gas nozzle 78 into the processing container 34 so as to etch and remove the first film deposited in the processing container 34. In the second cleaning process (S110), the first film deposited in the processing container 34 and the second film deposited in the gas nozzle 76 may be simultaneously etched. In the second cleaning process (S110), the second cleaning gas may be supplied from the gas nozzles 76 and 80 into the processing container 34. The second cleaning gas is a gas capable of etching and removing the first film deposited in the processing container 34, and may be selected depending on the type of the first film. If the first film is a silicon oxide film or a silicon nitride film HF, a mixture gas of $F_2$ and HF, a mixture gas of $F_2$ and $H_2$, $NF_3$ or the like may be used. Further, if the first film is a metal oxide film or a metal nitride film, HCl may be used. When the first film deposited in the processing container 34 is removed, the process is terminated.

According to the cleaning method of the first embodiment described above, during the first cleaning process (S104), the second film deposited in the gas nozzle 76, in which film peeling is likely to occur compared with the inside of the processing container 34, is selectively removed. Therefore, when restarting the film forming process (S102), a coating process for forming a predetermined film in the wafer processing region such as the inner wall of the processing container 34 or the like becomes unnecessary. Thus, it is possible to reduce the time required for the coating process, and thus the productivity is improved.

Second Embodiment

Figure 5:
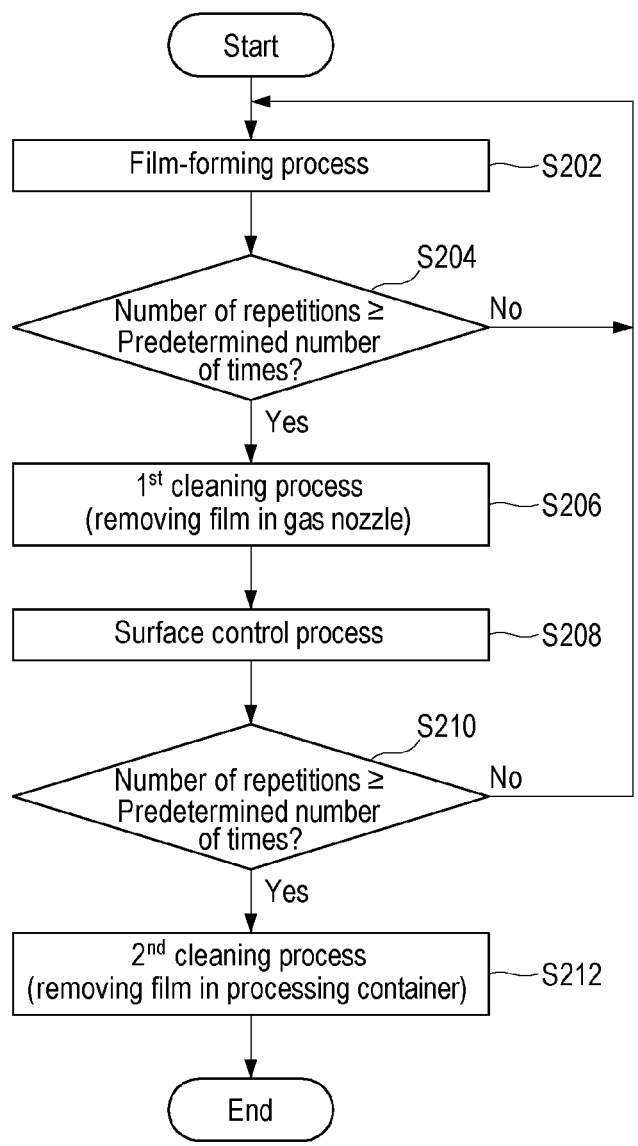
FIG. 5 is a flowchart illustrating an example of a cleaning method according to a second embodiment.

An example of a cleaning method according to the second embodiment will be described. The cleaning method according to the second embodiment may be performed by the controller 110 that controls the operation of respective parts of the vertical heat treatment apparatus 1. FIG. 5 is a flowchart illustrating an example of the cleaning method according to the second embodiment.

The cleaning method according to the second embodiment repeats a film forming process (S202), and if it is determined that the number of repetitions of the film forming process (S202) is equal to or more than a predetermined number of times, a first cleaning process (S206) and a surface control process (S208) are performed. Other points may be the same as those in the first embodiment. Hereinafter, points different from those of the first embodiment will be described.

As illustrated in FIG. 5, after performing the film forming process (S202), a determination process (S204) is performed in which it is determined whether or not the number of repetitions of the film forming process (S202) is equal to or more than a predetermined number of times. In the determination process (S204), if it is determined that the number of repetitions of the film forming process (S202) is equal to or more than the predetermined number of times, the process proceeds to the first cleaning process (S206). Meanwhile, if it is determined that the number of repetitions of the film forming process (202) is less than the predetermined number of times, the process returns to the film forming process (S202). The predetermined number of times is not particularly limited, but may be 5 times to 25 times.

Subsequently, a first cleaning process (S206) is performed. In the first cleaning process (S206), a first cleaning gas having an etching selection ratio of the second film to the first film being greater than 1 is supplied from the gas nozzle 76 into the processing container 34 so as to etch and remove the second film deposited in the gas nozzle 76.

Subsequently, a surface control process (S208) is performed. In the surface control process (S208), a surface state of the first film deposited in the processing container 34 is made close to the state before performing the first cleaning process (S206).

Subsequently, a determination process (S210) is performed. In the determination process (S210), it is determined whether or not the number of repetitions of a cycle including the film forming process (S202), the determination process (S204), the first cleaning process (S206), and the surface control process (S208) is equal to or more than a predetermined number of times. In the determination process (S210), if it is determined that the number of repetitions of the cycle is equal to or more than the predetermined number of times, the process proceeds to a second cleaning process (S212). Meanwhile, if it is determined that the number of repetitions of the cycle is less than the predetermined number of times, the process returns to the film forming process (S202). The predetermined number of times is not particularly limited, but may be 10 times to 50 times.

Subsequently, the second cleaning process (S212) is performed. In the second cleaning process (S212), the second cleaning gas is supplied from the gas nozzle 78 into the processing container 34. In the second cleaning process (S212), the first film deposited in the processing container 34 and the second film deposited in the gas nozzle 76 may be simultaneously etched and removed. When the first film deposited in the processing container 34 and the second film deposited in the gas nozzle 76 are removed, the process is terminated.

According to the cleaning method of the second embodiment described above, during the first cleaning process (S206), the second film deposited in the gas nozzle 76, in which film peeling is likely to occur compared with the inside of the processing container 34, is selectively removed. Therefore, when restarting the film forming process (S202), a coating process for forming a predetermined film in the wafer processing region such as the inner wall of the processing container 34 or the like becomes unnecessary. Thus, it is possible to omit the time required for the coating process, and thus the productivity is improved.

Third Embodiment

Figure 6:
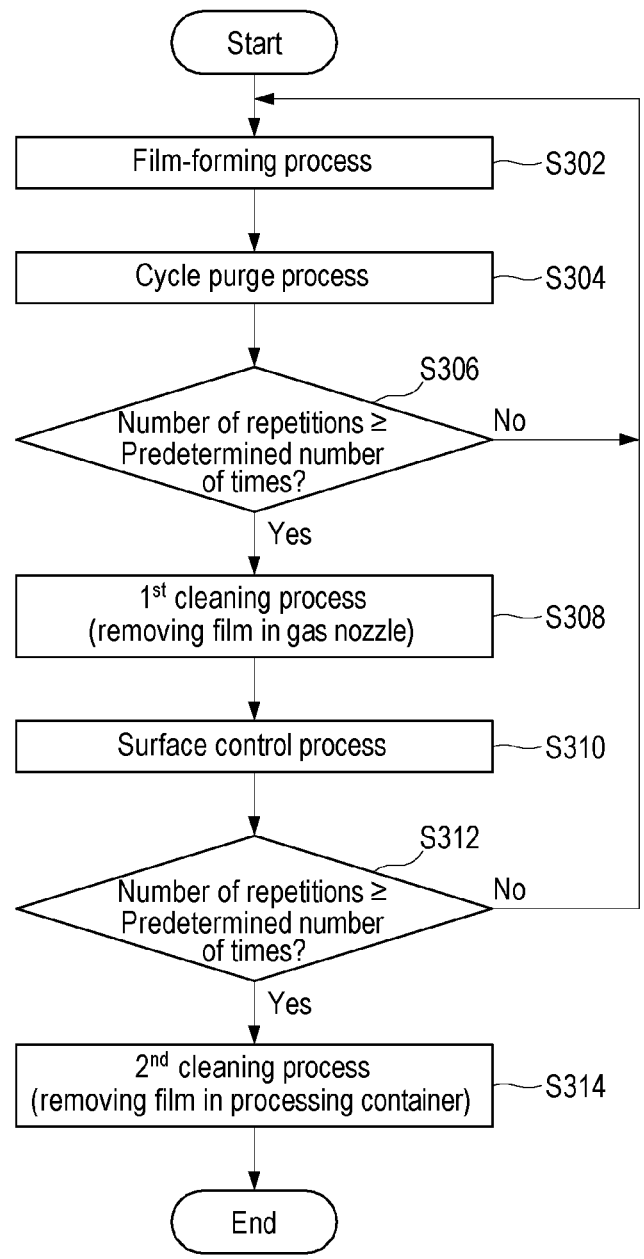
FIG. 6 is a flowchart illustrating an example of a cleaning method according to a third embodiment.

An example of a cleaning method according to the third embodiment will be described. The cleaning method according to the third embodiment may be performed by the controller 110, controlling the operation of respective parts of the vertical heat treatment apparatus 1. FIG. 6 is a flowchart illustrating an example of the cleaning method according to the third embodiment.

In the cleaning method according to the third embodiment, a cycle purge process (S304) is performed after the film forming process (S302). Other points may be the same as those in the second embodiment. Hereinafter, points different from those of the second embodiment will be described.

As illustrated in FIG. 6, after performing the film forming process (S302), the cycle purge process (S304) is performed. The cycle purge process (S304) is a process in which a cycle of supplying an inert gas from the gas nozzle 80 into the processing container 34 to raise the pressure, mixing the inert gas with a reaction product, then evacuating the inside of the processing container 34, and supplying the inert gas again is performed a plurality of times. In the cycle purge process (S304), the inert gas may be supplied from the gas nozzles 76 and 78 into the processing container 34.

Subsequently, a determination process (S306) is performed. In the determination process (S306), it is determined whether or not the number of repetitions of the film forming process (S302) is equal to or more than a predetermined number of times. In the determination process (S306), if it is determined that the number of repetitions of the film forming process (S302) is equal to or more than the predetermined number of times, the process proceeds to a first cleaning process (S308). Meanwhile, if it is determined that the number of repetitions of the film forming process (S302) is less than the predetermined number of times, the process returns to the film forming process (S302). The predetermined number of times is not particularly limited, but may be 5 times to 25 times.

Subsequently, the first cleaning process (S308) is performed. In the first cleaning process (S308), a first cleaning gas having an etching selection ratio of the second film to the first film being greater than 1 is supplied from the gas nozzle 76 into the processing container 34 so as to etch and remove the second film deposited in the gas nozzle 76.

Subsequently, a surface control process (S310) is performed. In the surface control process (S310), a surface state of the first film deposited in the processing container 34 is made close to the state before performing the first cleaning process (S308).

Subsequently, a determination process (S312) is performed. In the determination process (S312), it is determined whether or not the number of repetitions of a cycle including the film forming process (S302), the cycle purge process (S304), the determination process (S306), the first cleaning process (S308), and the surface control process (S310) is equal to or more than a predetermined number of times. In the determination process (S312), if it is determined that the number of repetitions of the cycle is equal to or more than the predetermined number of times, the process proceeds to a second cleaning process (S314). Meanwhile, if it is determined that the number of repetitions of the cycle is less than the predetermined number of times, the process returns to the film forming process (S302). The predetermined number of times is not particularly limited, but may be 10 times to 50 times.

Subsequently, the second cleaning process (S314) is performed in which the second cleaning gas is supplied from the gas nozzle 78 into the processing container 34. In the second cleaning process (S314), the first film deposited in the processing container 34 and the second film deposited in the gas nozzle 76 may be simultaneously etched and removed. When the first film deposited in the processing container 34 and the second film deposited in the gas nozzle 76 are removed, the process is terminated.

According to the cleaning method of the third embodiment described above, during the first cleaning process (S308), the second film deposited in the gas nozzle 76, in which film peeling is likely to occur compared with the inside of the processing container 34, is selectively removed. Therefore, when resuming the film forming process (S302), a coating process for forming a predetermined film in the wafer processing region such as the inner wall of the processing container 34 or the like becomes unnecessary. Thus, it is possible to omit the time required for the coating process, and thus the productivity is improved.

In each of the above embodiments, the gas nozzle 76 is an example of a source gas supply part, and the gas nozzle 78 is an example of a reaction gas supply part.

Although the embodiments for carrying out the present disclosure have been described above, the above contents do not limit the contents of the present disclosure, and various modifications and improvements are possible within the scope of the present disclosure.

In the embodiments described above, a batch-type vertical heat treatment apparatus, which performs a process on a plurality of wafers at a time, has been described as an example of a film forming apparatus, but the present disclosure is not limited thereto. The film forming apparatus may be a single wafer type apparatus, which processes wafers one by one. Further, the film forming apparatus may be a semi-batch type apparatus, which revolves a plurality of wafers disposed on a rotary table in a processing container by the rotary table and allows the plurality of wafers to sequentially pass through a region to which a source gas is supplied and a region to which a reaction gas reactive with the source gas is supplied such that a film is formed on the surfaces of the wafers.

According to the disclosed cleaning method, it is possible to suppress the deterioration in productivity, which is caused due to performing a cleaning process on a film forming apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning a film forming apparatus conducted after a film forming process by supplying a source gas and a reaction gas reactive with the source gas to produce a reaction product into a processing container to form a film of the reaction product on a substrate, the method comprising:

repeating, a plurality of times, a cycle including:
performing, at least one time, the film forming process of depositing a first film in the processing container and a second film in a source gas nozzle supplying the source gas into the processing container, the first film and the second film being different from each other;
performing, after the film forming process, a first cleaning process by supplying a first cleaning gas having an etching selection ratio of the second film to the first film that is greater than 1 from the source gas nozzle into the processing container so as to etch and remove the second film deposited in the source gas nozzle such that the deposited first film remains in the processing container; and performing, after the first cleaning process is terminated, in a state in which the deposited first film remains in the processing container, a surface control process of supplying an additional gas into the processing container in a state in which the supply of the first cleaning gas is terminated; and after repeating the cycle the plurality of times, performing a second cleaning process by supplying a second cleaning gas into the processing container so as to etch and remove at least the first film deposited in the processing container, wherein in the surface control process, if the first film is an oxide film, an oxygen containing gas is selected as the additional gas, and if the first film is a nitride film, a nitrogen containing gas is selected as the additional gas.

2. The method of claim 1, wherein during the film forming process, an inert gas is supplied from the source gas nozzle when supplying the reaction gas.

3. The method of claim 1, wherein during the film forming process, a supply of an inert gas from the source gas nozzle is started prior to starting the supply of the source gas.

4. The method of claim 1, wherein during the film forming process the source gas and an inert gas are simultaneously supplied from the source gas nozzle when supplying the reaction gas.

5. The method of claim 4, wherein a flow rate of the inert gas is larger than a flow rate of the source gas.

6. The method of claim 1, wherein during the film forming process, an inert gas is constantly supplied from the source gas nozzle.

7. The method of claim 2, wherein the inert gas is supplied from an upstream side of the source gas.

8. The method of claim 1, wherein the first cleaning process is performed each time the film forming process is performed once.

9. The method of claim 1, wherein the first cleaning process is performed each time the film forming process is performed at a predetermined multiple times.

10. The method of claim 1, wherein the source gas is a silicon containing gas,
the reaction gas is an oxidizing gas, and
the first cleaning gas is a gas selected from a group consisting of $F_2$, $Cl_2$, $NF_3$, and $ClF_3$.

11. The method of claim 10, wherein the additional gas supplied in the surface control process is an oxygen containing gas.

12. The method of claim 1, wherein the source gas is a silicon containing gas,
the reaction gas is a nitriding gas, and
the first cleaning gas is a gas selected from a group consisting of $F_2$, $Cl_2$, $NF_3$, and $ClF_3$.

13. The method of claim 12, wherein the additional gas supplied in the surface control process is a nitrogen containing gas.

14. The method of claim 1, wherein the second cleaning process includes selecting the second cleaning gas depending on a composition of the first film.

15. The method of claim 1, wherein the source gas is a silicon containing gas,
the reaction gas is one selected from a group consisting of a nitriding gas and an oxidizing gas,
the first cleaning gas includes a gas selected from a group consisting of $F_2$, $Cl_2$, $NF_3$, and $ClF_3$, and
the second cleaning gas is a gas selected from a group consisting of HF, $F_2$, $H_2$, and $NF_3$.

16. The method of claim 1, wherein the source gas is a metal containing gas,
the reaction gas is one selected from a group consisting of a nitriding gas and an oxidizing gas,
the first cleaning gas is a gas selected from a group consisting of $F_2$, $Cl_2$, $NF_3$, and $ClF_3$, and
the second cleaning gas is HCl.

* * * * *